United States Patent
Horikoshi et al.

(10) Patent No.: US 7,154,044 B2
(45) Date of Patent: Dec. 26, 2006

(54) FLAT CABLE CONDUCTOR, METHOD OF MAKING THE SAME AND FLAT CABLE USING THE SAME

(75) Inventors: Toshiyuki Horikoshi, Hitachi (JP); Takaaki Ichikawa, Mito (JP); Katsuo Endo, Hitachi (JP); Masato Ito, Hitachi (JP); Hideo Matsuo, Hitachi (JP)

(73) Assignee: Hitachi Cable Ltd., Tokyo (JP)

( * ) Notice: Subject to any disclaimer, the term of this patent is extended or adjusted under 35 U.S.C. 154(b) by 22 days.

(21) Appl. No.: 11/044,622

(22) Filed: Jan. 28, 2005

(65) Prior Publication Data

US 2005/0211461 A1  Sep. 29, 2005

(30) Foreign Application Priority Data

Jan. 30, 2004 (JP) ............... 2004-023994

(51) Int. Cl.
*H01B 5/00* (2006.01)
(52) U.S. Cl. ............... 174/126.1; 174/117 F; 174/117 FF
(58) Field of Classification Search ........ 174/36, 174/102 R, 106 R, 126.1, 110 R, 117 F, 174/117 FF
See application file for complete search history.

(56) References Cited

U.S. PATENT DOCUMENTS 3,576,723 A * 4/1971 Angele ............... 205/187

5,209,987 A * 5/1993 Penneck et al. ........... 428/610

FOREIGN PATENT DOCUMENTS

| JP | 07-099012 | * 4/1995 |
|----|-----------|----------|
| JP | 2942458 | 6/1999 |
| JP | 2000-173364 | * 6/2000 |
| JP | 2001-43743 | 2/2001 |
| JP | 2001-43744 | 2/2001 |
| JP | 2001-43745 | 2/2001 |
| JP | 2001-73186 | 3/2001 |
| JP | 2002-42556 | 2/2002 |

OTHER PUBLICATIONS

Hiroshi Yamanobe et al., "Reliability for Flexible Flat Cable (FFC)", Hitachi Cable Review, Hitachi Cable, Ltd., 2000, No. 19 (Jan. 2000), p. 53-56.

* cited by examiner

*Primary Examiner*—William H. Mayo, III
(74) *Attorney, Agent, or Firm*—McGinn IP Law Group,PLLC

(57) ABSTRACT

A flat cable conductor has: a conductor made of copper or a copper alloy; a first plating film made of tin and/or a tin-copper alloy, the first plating film being formed around the conductor; and a second plating film made of an alloy of tin and a third element selected from Au, Ag, Ni, Ge, Zn and Bi, the second plating film being formed around the first plating film. The third element has a concentration of 0.01 or more and 80 or less wt % at an outer surface of the second plating film.

20 Claims, 4 Drawing Sheets

FLAT CABLE CONDUCTOR, METHOD OF MAKING THE SAME AND FLAT CABLE USING THE SAME

The present application is based on Japanese patent application No. 2004-023994, the entire contents of which are incorporated herein by reference.

BACKGROUND OF THE INVENTION

1. Field of the Invention

This invention relates to a flat cable conductor with a solder plating film formed on the surface, method of making the flat cable conductor and a flat cable using the flat cable conductor.

2. Description of the Related Art

At present, a flexible flat cable (herein referred to as FFC) is used as an internal wiring member for external storage devices (CD-ROM drive, DVD-ROM drive etc.) in a small printer, a personal computer etc. and for electronic products such as a video game machine.

FIG. 1 is a perspective view showing a basic structure of a conventional FFC. The FFC 30 is a thin and flexible tape-shaped cable or wire with a thickness of 100 to 300 μm, where a plurality of flat cable conductors 32 with a thickness of several tens of micrometers are in parallel arranged into a conductor array. The FFC 30 is manufactured such that the conductor array of flat cable conductors 32 arranged in parallel is sandwiched by insulative plastic films 33a, 33b with an adhesive layer formed on one surface thereof, and it is continuously pressure-bonded by a hot roll. A solder plating rectangular soft copper wire is used as the rectangular conductor 32, nonflammable polyester is used as the adhesive, and a polyethylene terephthalate film is used as the insulative plastic films 33a, 33b (Hiroshi Yamanobe et al., "Reliability of Flexible Flat Cable (FFC)", Hitachi Cable Review, Hitachi Cable, Ltd., 2000, No. 19(2000-1), p. 53–56).

The flat cable conductor 32 is, as described above, made of the solder plating rectangular soft copper wire and it is manufactured, for example, as described below. First, a solder (Sn-5 wt % Pb) plating film is about 6 μm thick electroplated around a pure copper wire (φ0.6 mm) as a base material. Then, the solder plating pure copper wire is cold-drawn to φ0.1 mm and then it is rolled into a precise rectangular wire with predetermined dimensions (e.g., 0.05 mm in thickness and 0.32 mm width). Finally, the precise rectangular wire is annealed to have the solder plating rectangular soft copper wire (Japanese patent No. 2942458).

In recent years, from the viewpoint of environmental suitability, a Pb-free material (non lead material) or non-halogen material is desired, and therefore a corresponding solution is also required of materials used for the FFC.

Thus, it is demanded that the solder plating film on the surface of the flat cable conductor 32 is free from Pb.

The solder plating film used thus far is generally made of a solder that 1 to 10 wt % lead (Pb) is added to tin (Sn). Pb is added to Sn so as to reduce the melting point of Sn plating and to prevent the generation of whisker (hair-like single crystal) from the surface of the pure Sn plating film. Therefore, when Pb is removed from the conventional solder composition to have the pure Sn plating so as to address the Pb-free solution, an increase in the melting point and the generation of whisker will be of concern. The generation of whisker is not desirable since it causes a short-cut between the conductors of FFC.

So, as a solder Sn alloy used for Pb-free solder plating, for example, Sn—Bi alloy, Sn—Ag alloy and Sn—Cu alloy are developed, and corresponding electroplating solutions are developed and are partially in practical use. The Sn alloys for solder plating need to have reliability properties, such as melting point, solder wettability and anti-whisker property, equal to those of the conventional ones Some FFC's using such a Pb-free solder plating rectangular conductor are disclosed (Japanese patent application laid-open Nos. 2001-43743, 2001-43744, and 2001-43745).

Further, some FFC's are disclosed that its solder plating film of pure Sn is thermally refined to prevent the generation of whisker while keeping its solder wettability (Japanese patent application laid-open Nos. 2001-73186, 2000-173364 and 2002-42556).

However, the Pb-free solder plating is inferior to the conventional Sn—Pb plating in the aspect of easiness of electroplating and manufacturing cost Therefore, a further improvement is desired thereon.

The FFC using the Pb-free solder plating rectangular conductor has, in itself, a high reliability in anti-whisker property. However, as a metal terminal plating to be fitted to a FFC is recently made to be Pb-free, its compression stress is likely to increase when the FFC is fitted or connected to the connector. Along with the increase of compression stress, a whisker is likely to be generated from the surface of the Pb-free solder plating film in the flat cable conductor of PFC. Therefore, a further enhancement in reliability of the Pb-free solder plating is desired,

SUMMARY OF THE INVENTION

It is an object of the invention to provide a flat cable conductor that improves the prevention of whicker generated from the surface of a solder plating film formed around a conductor.

It is a further object of the invention to provide a method of making the flat cable conductor.

It is a further object of the invention to provide a flat cable using the flat cable conductor.

(1) According to one aspect of the invention, a flat cable conductor comprises:

a conductor that comprises copper or a copper alloy;

a first plating film that comprises tin and/or a tin-copper alloy, the first plating film being formed around the conductor; and a second plating film that comprises an alloy of tin and a third element selected from Au, Ag, Ni, Ge, Zn and Bi, the second plating film being formed around the first plating film, wherein the third element has a concentration of from 0.01 to 80 wt % at an outer surface of the second plating film.

It is preferable that the second plating film is a gradient plating film that the concentration of the third element increases from an inner circumference of the second plating film toward an outer circumference of the second plating film It is preferable that the second plating film has a thickness 1/100 to 1/2 of the thickness of the first plating film.

It is preferable that the conductor is a rectangular conductor.

(2) According to another aspect of the invention, a method of making a flat cable conductor comprises the steps of:

forming a tin plating film around a conductor that comprises copper or a copper alloy;

forming a third element plating film that comprises a third element selected from Au, Ag, Ni, Ge, Zn and Bi around the tin plating film; and applying a diffusion process to the conductor such that an element is mutually diffused between the conductor and the tin plating film and between the tin plating film and the third element plating film, wherein, in the diffusion process, a first plating film is formed around the conductor, the first plating film comprising tin and/or a tin-copper alloy, and a second plating film is formed around the first plating film, the second plating film comprising an alloy of tin and a third element selected from Au, Ag, Ni, Ge, Zn and Bi.

It is preferable that the diffusion process is conducted such that the third element has a concentration of from 0.01 to 80 wt % at an outer surface of the second plating film.

(3) According to another aspect of the invention, a flat cable comprises:

a plurality of flat cable conductors that are arranged in parallel into a conductor array; and an insulation layer that is formed on both surfaces of the conductor array, wherein the plurality of flat cable conductors each comprises:

a conductor that comprises copper or a copper alloy;

a first plating film that comprises tin and/or a tin-copper alloy, the first plating film being formed around the conductor; and a second plating film that comprises an alloy of tin and a third element selected from Au, Ag, Ni, Ge, Zn and Bi, the second plating film being formed around the first plating film, wherein the third element has a concentration of from 0.01 to 80 wt % at an outer surface of the second plating film.

It is preferable that the insulation layer comprises a plastic film with an adhesive layer formed on one surface thereof.

(4) According to another aspect of the invention, a flat cable conductor comprises:

a conductor that comprises copper or a copper alloy; and a plating film that comprises tin and a third element selected from Au, Ag, Ni, Ge, Zn and Bi, the plating film being formed around the conductor, wherein plating film is a gradient plating film that the third element has a peak concentration in the vicinity of an outer surface of the plating film.

<Advantages of the Invention>

The flat cable conductor of the invention can offer both the Pb-free solution and the suppression of whisker sensitivity without increasing the manufacturing cost by that: a second plating film made of an alloy of tin and a third element is formed around a Sn plating conductor (a conductor with a first Sn plating film formed thereon); and the concentration of the third element at the outer surface of the second plating film is controlled to increase to a predetermined value

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

In developing a Pb-free flat cable conductor, pure tin plating is most advantageous to reduce the manufacturing cost. However, if the pure tin plating is adopted for a solder plating film of the conductor, the generation of whisker will be of concern at the surface of the solder plating film. In fact, the high whisker sensitivity of pure tin plating film is of concern in the filed of electronic devices. Therefore, the whisker sensitivity of pure tin plating needs to be suppressed This can be solved, as described earlier, by using a tin alloy plating film, but the manufacturing cost will be adversely increased.

The inventors find that the flat cable conductor of the invention can offer both the Pb-free solution and the suppression of whisker sensitivity without increasing the manufacturing cost by that; a second plating film made of an alloy of tin and a third element is formed around a Sn plating conductor (a conductor with a first Sn plating film formed thereon); and the concentration of the third element at the outer surface of the second plating film is controlled to increase to a predetermined value.

Figure 2:
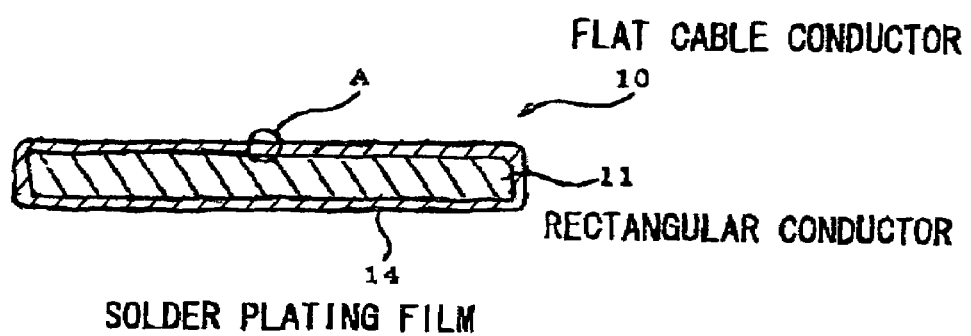
FIG. 2 is a cross sectional view showing a flat cable conductor 10 in a preferred embodiment of the invention.
Figure 3:
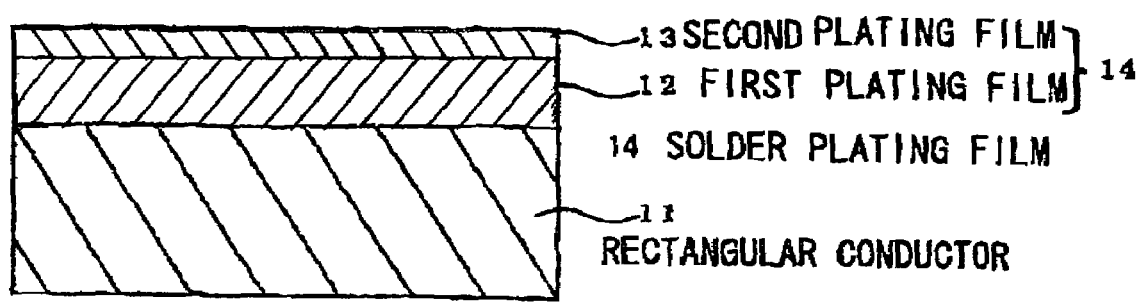
FIG. 3 is an enlarged cross sectional view showing part A in FIG. 2.

FIG. 2 is a cross sectional view showing a flat cable conductor 10 in the preferred embodiment of the invention. FIG. 3 is an enlarged cross sectional view showing circled part A in FIG. 2.

As shown in FIG. 2, the flat cable conductor 10 is formed such that a first plating film (Sn—Cu alloy plating film) 12 is formed around a rectangular conductor 11 that is made of Cu or Cu alloys, and a second plating film 13 made of an alloy composed of tin and a third element selected from Au, Ag, Ni, Ge, Zn and Bi is formed around the first plating film (Sn—Cu alloy plating film) 12 The concentration of the third element at the outer surface of the second plating film 13 is controlled to be 0.01 to 80 wt %, preferably 1.0 to 50 wt %. A solder plating film 14 of the flat cable conductor 10 is composed of the first plating film (Sn—Cu alloy plating film) 12 and the second plating film 13.

The first plating film (Sn—Cu alloy plating film) 12 is a compositionally gradient plating film composed such that the Sn concentration increases continuously from the inner circumference to the outer circumference, and the Cu concentration decreases continuously from the inner circumference to the outer circumference. The second plating film 13 is a compositionally gradient plating film composed such that the concentration of the third element of Au, Ag, Ni, Ge, Zn or Bi increases continuously from the inner circumference to the outer circumference, and the Sn concentration decreases continuously from the inner circumference to the outer circumference.

The second plating film 13 has a thickness $\frac{1}{100}$ to $\frac{1}{2}$, preferably $\frac{1}{10}$ to $\frac{1}{3}$, of the thickness of the first plating film (Sn—Cu alloy plating film) 12. For example, when the rectangular conductor 11 has a thickness of 0.05 mm, the second plating film 13 has a thickness of 0.1 to 0.5 μm, preferably 0.1 to 0.3 μm, and the first plating film (Sn—Cu alloy plating film) 12 has a thickness of 0.5 to 5.0 μm, preferably 1.0 to 2.0 μm.

Figure 1:
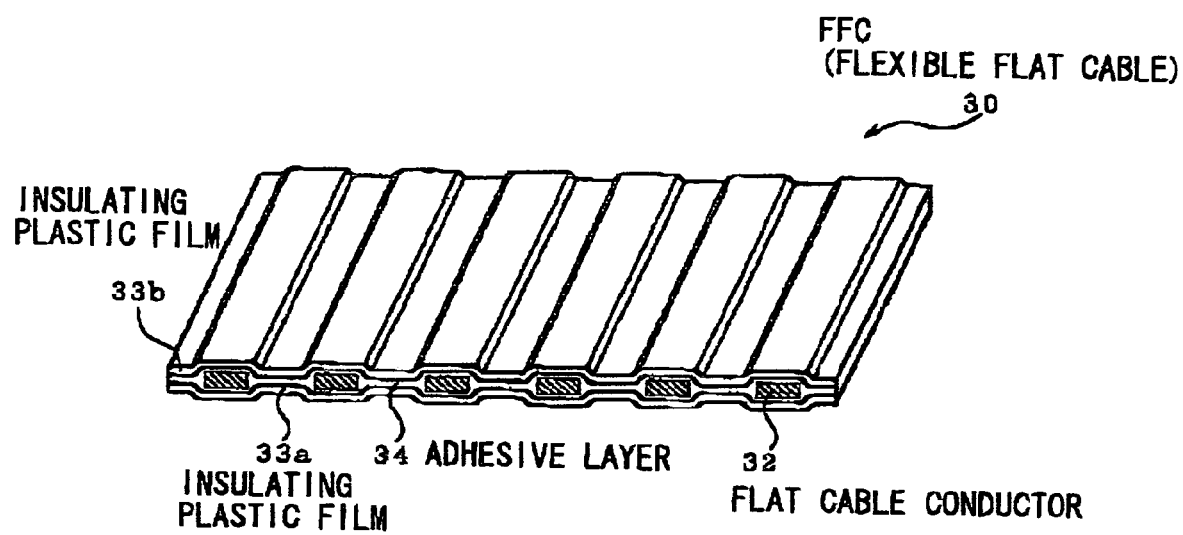
FIG. 1 is a perspective view showing the basic structure of the conventional flexible flat cable (FFC)

The reason why the concentration of the third element at the outer surface of the second plating film 13 is 0.01 wt % or more is that, if it is less than 0.01 wt %, the whicker suppression effect of the third element cannot be obtained, and, when the FFC 30 is fitted to a connector, a whisker is likely to be generated from the surface of the second plating file 13 in the flat cable conductor 10 of FFC 30 (See FIG. 1). Further, the reason why the concentration of the third element at the outer surface of the second plating film 13 is 80 wt % or less is that, if it exceeds 80 wt %, the wettability of the solder (the alloy of tin and the third element) composing the second plating film 13 is reduced and the flexibility of the flat cable conductor 10 is reduced.

The rectangular conductor 11 may be made of any of Cu or Cu alloy materials that are conventionally used as a material for flat cable conductors, and are not specifically limited.

Alternatively, the first plating film 12 may be, other than only the Sn—Cu alloy plating film, structured such that a tin plating film substantially not containing Cu and the third element (ie, a pure tin plating layer) is sandwiched between the Sn—Cu alloy plating film and the second plating film 13. In other words, the pure tin plating layer may be formed to be connected to the tin and third element containing region where the diffusion concentration of the third element gradually decreases from the surface of the second plating film 13 toward the pure tin paling layer. Further, the pure tin plating layer may be formed to be connected to the Sn and Cu containing region where the Cu diffusion concentration gradually decreases from the surface of the rectangular conductor 11 toward the pure tin plating layer.

Next, a method of making the flat cable conductor 10 in the preferred embodiment of the invention will be explained referring to the attached drawings.

First, a Sn plating film is formed around the rectangular conductor 11 (e.g., a pure copper wire) made of Cu or Cu alloys, and then a third element plating film made of the third element selected from Au, Ag, Ni, Ge, Zn and Bi is formed around the Sn plating film.

Then, the pure copper wire with the Sn plating film and the third element plating film formed thereon is subjected to a wire drawing process (e.g., cold drawing process) and rolling process (e.g., roll-rolling process), and a precise rectangular wire is thereby produced that has the same shape and dimensions as the final shape and dimensions of the flat cable conductor 10.

Then, the precise rectangular wire is subjected to a diffusion process. Thereby, the elements contained are mutually diffused between the conductor 11 and the Sn plating film, and between the Sn plating film and the third element plating film. In this process, the conditions of the diffusion process (applied voltage and voltage applying time, or thermal treatment temperature and thermal treatment time) are controlled such that the concentration of the third element at the outer surface of the second plating film 13 falls within 0.01 to 80 wt %.

Due to the mutual diffusion, the first plating film (Sn—Cu alloy plating film) 12 is formed at a portion on the outer circumference of the conductor 11 and at a portion on the inner circumference of the Sn plating film, ie., at the interface of the conductor 11 and the Sn plating film and in the vicinity of the interface. The first plating film (Sn—Cu alloy plating film) 12 is a compositionally gradient plating film composed such that the Sn concentration increases continuously from the inner circumference to the outer circumference.

Further, the second plating film 13 is formed at a portion on the outer circumference of the Sn plating film and at a portion on the inner circumference of the third element plating film, i.e, at the interface of the Sn plating film and the third element plating film and in the vicinity of the interface. The second plating film 13 is a compositionally gradient plating film composed such that the concentration of the third element increases continuously from the inner circumference to the outer circumference.

As a result, the flat cable conductor 10 as shown in FIG. 2 can be obtained that the first plating film (Sn—Cu alloy plating film) 12 and the second plating film 13 are formed in this sequence around the rectangular conductor 11.

The diffusion process is conducted by using, e.g., an electric annealer while moving the precise rectangular wire at a line speed of 100 m/min and applying a voltage of 8.5 to 12.0 V and a current of 5.0 to 6.5 A thereto. In this power supplying condition, the applied current is controlled to be higher when the applied voltage is low, and the applied current is controlled to be lower when the applied voltage is high. The diffusion process may be conducted by using an annealing furnace while moving the precise rectangular wire and applying thereto a thermal treatment on the conditions of 800 to 1000° C.×5 to 10 m/min in a reduction atmosphere In this thermal treatment condition, the treatment time is controlled to be longer when the thermal treatment temperature is low, and the treatment time is controlled to be shorter when the thermal treatment temperature is high. The respective conditions of the diffusion process can be varied according to the size of the precise rectangular wire, the kind of elements composing the third element plating film, the thickness of the third element plating film, the moving speed of the precise rectangular wire etc.

Finally, the FFC (not shown) in the preferred embodiment of the invention can be obtained by forming insulation layers on both sides of a conductor array of the flat cable conductors 10 of this embodiment that are arranged in parallel, wherein the insulation layers are formed by pasting together plastic film materials with an adhesive layer formed on one surface thereof.

Namely, the FFC of this embodiment is composed such that the flat cable conductors 32 of the FFC 30 as shown in FIG. 1 are replaced by the flat cable conductors 10.

The FFC may be formed such that only one end of the flat cable conductor 10 is exposed by peeling one end of the plastic film material in the longitudinal direction of the flat cable conductor 10.

The adhesive layer can be of an adhesive material such as nonflammable polyester, and the plastic film material can be of polyester, polyethylene terephthalate etc.

Next, the effects of this embodiment will be explained.

In the manufacture of the flat cable conductor 10 of the embodiment, the solder plating film formed around the conductor of pure copper wire etc. is provided as the pure Sn plating film and the third element plating film (the plating film made of Au, Ag, Ni, Ge. Zn or Bi), not as a plating film of alloy. Therefore, the solder plating film can be easily formed without using any special plating solution. Thus, the manufacturing cost can be reduced.

Further, the conductor with the pure Sn plating film and the third element plating film formed thereon is molded into the precise rectangular wire with the final shape and dimensions, and then the diffusion process is conducted such that the elements are mutually diffused between the conductor and the Sn plating film, and between the Sn plating film and the third element plating film. As a result, around the rectangular conductor 11, the first plating film (Sn—Cu alloy plating film) 12 can be formed that the Sn concentration continuously increases from the inner circumference to the outer circumference, and the second plating film 13 can be on the first plating film 12 formed that the concentration of the third element continuously increases from the inner circumference to the outer circumference. By controlling the concentration of the third element at the outer surface of the second plating film 13 to be 0.01 to 80 wt %, the whisker sensitivity of the solder plating film 14 in the flat cable conductor 10 can be reduced to prevent the generation of whisker.

Thus, the flat cable conductor 10 of the embodiment can have an anti-whisker property equal to that of the Sn—Pb solder plating, which is conventionally known as a material with a good anti-whisker property, while satisfying the needs for Pb-free flat cable conductor. Therefore, by applying the flat cable conductor 10 of the embodiment to a FFC for Pb-free electronic devices desired, the whisker can be less generated on the surface of the solder plating film 14 in the flat cable conductor 10 even when a large compression force is applied to the FFC in fitting the FFC to a connector. Hence, the FFC can avoid any trouble such as short-circuit between the conductors caused by the generation of whisker.

Further, the flat cable conductor 10 of the embodiment can be also applied to, other than the FFC, a conductor member such as a connector terminal connected to an FFC and a lead frame as a semiconductor parts to require a high reliability in anti-whisker property.

Since, from the viewpoint of phase structure, the rectangular conductor 11, the first plating film (Sn—Cu alloy plating film) 12 and the second plating film 13 are substantially integrated each other to form the flat cable conductor 10, a good adhesiveness can be obtained among the rectangular conductor 11, the first plating film (Sn—Cu alloy plating film) 12 and the second plating film 13. Therefore, even when a FFC using the flat cable conductor 10 is bent, the solder plating film 14 is unlikely to be peeled from the rectangular conductor 11 in the flat cable conductor 10

Alternatively, the condition of the diffusion process may be varied such that Cu of the rectangular conductor 11 is diffused into the second plating film 13, which is the outermost layer of the flat cable conductor 10, to allow the second plating film 13 to be a compositionally gradient plating film made of Sn—Cu—Au alloy, Sn—Cu—Ag alloy, Sn—Cu—Ni alloy, Sn—Cu—Ge alloy, Sn—Cu—Zn alloy or Sn—Cu—Bi alloy. Thereby, the rectangular conductor 11, the Sn—Cu alloy plating film 12 and the second plating film 13 can be integrated much strongly.

Although the method of making the flat cable conductor 10 in this embodiment is conducted such that the pure tin plating film and the third element plating film are formed around the conductor and then the diffusion process is only once applied thereto, the invention is not limited to this process. For example, a first diffusion process may be conducted to form the first plating film (Sn—Cu alloy plating film) 12 after the pure tin plating film is formed around the conductor, and then a second diffusion process may be conducted to form the second plating film 13 after the third element plating film is formed around the first plating film (Sn—Cu alloy plating film) 12. Further, the diffusion process may be conducted once before the rolling process and may be conducted again after the rolling process. The flat cable conductor thus obtained can have the same effect as the flat cable conductor 10 of the embodiment.

The third element is not limited to Au, Ag, Ni, Ge, Zn and Bi, and may be a material that allows the second plating film 13 to be a compositionally gradient plating film composed such that the concentration of the third element increases from the inner circumference toward the outer circumference.

Next, Examples of the invention will be explained although the invention is not limited to them.

EXAMPLE 1

A 6 μm thick Sn plating film is formed around a copper wire of φ6 mm by electroplating, and then a 1 μm thick pure Ag plating film is formed thereon by flash plating. Then, the Ag plating copper wire is cold-drawn to φ0.1 mm and is processed by a rolling mill roll into a precise rectangular wire with a thickness of 0.05 mm and a width of 0.32 mm.

The precise rectangular wire is subjected to the diffusion process using an electric annealer so as to have a flat cable conductor. In this process, the power supplying conditions are controlled to be a voltage of 10 V, a current of 5.8 A and a line speed of 100 m/min such that the Ag concentration at the surface of solder plating film is 28 wt % after the diffusion process SIMS (secondary ion mass spectrometry) is used for the quantitative analysis of the Ag concentration at the surface of solder plating film.

The twenty annealed flat cable conductors are in parallel arranged into a conductor array at pitches of 0.5 mm. Then, both surfaces of the conductor array are laminated by polyester films with a polyester adhesive layer formed on one surface thereof so as to have a FFC. Then, the FFC is cut into a predetermined length, and only the polyester film at one and in the longitudinal direction of the conductor is peeled to expose only one end of the flat cable conductors to have the FFC structured as shown in FIG. 1. The flat cable conductor of the FFC has the solder plating film that is composed of a Sn—Cu alloy gradient plating film on the inner circumference and a Sn—Ag alloy gradient plating film on the outer circumference.

EXAMPLE 2

In Example 2, a FFC structured as shown in FIG. 1 is produced by the same process as Example 1 except that a 1 μm pure Zn plating film is formed by flash plating on the Sn plating copper wire. The flat cable conductor of the FFC has the solder plating film that is composed of a Sn—Cu alloy gradient plating film on the inner circumference and a Sn—Zn alloy gradient plating film on the outer circumference.

Comparative Example 1

A 6 μm thick Sn plating film is formed around a copper wire of φ0.6 mm by electroplating. Then, the Sn plating copper wire is cold-drawn to φ0.1 mm and is processed by a rolling mill roll into a precise rectangular wire with a thickness of 0.05 mm and a width of 0.32 mm.

Subsequently, the same processes as Example 1 are conducted to have a FFC structured as shown in FIG. 1. The flat cable conductor of the FFC has the solder plating film that is composed of the pure Sn plating film.

Comparative Example 2

A 10 μm thick Sn-5 wt % Pb plating film is formed around a copper wire of φ0.6 mm by electroplating. Then, the Sn—Pb plating copper wire is cold-drawn to φ0.1 mm and is processed by a rolling mill roll into a precise rectangular wire with a thickness of 0.05 mm and a width of 0.32 mm.

Subsequently, the same processes as Example 1 are conducted to have a FFC structured as shown in FIG. 1. The flat cable conductor of the FFC has the solder plating film that is composed of the Sn—Pb alloy plating film.

The FFC's of Examples 1, 2 and Comparative Examples 1, 2 are fitted to a connector (with Pb-free solder plating) and a room temperature test (25° C.), a thermal shock test (−55 to 125° C.) and a humidity test (55° C., 95% RH) are conducted 1000 hrs to each of the examples. Then, the FFC is disconnected from the connector, and the generation of whisker on the surface of solder plating film in the fitting portion (connection portion) of the connector is observed by an electron microscope. The anti-whicker property of the FFC after the respective tests and the environmental suitability of the FFC are evaluated as shown in Table 1.

TABLE 1

|  | Solder plating film | Anti-whisker property | | | Environmental suitability |
|---|---|---|---|---|---|
|  |  | Room temperature test | Thermal shock test | Humidity test |  |
| Example 1 | Sn—Ag alloy gradient plating film/Sn—Cu alloy gradient plating film | Good | Good | Good | Suitable |
| Example 2 | Sn—Zn alloy gradient plating film/Sn—Cu alloy gradient plating film | Good | Good | Good | Suitable |
| Comparative Example 1 | Pure Sn plating film | No good | No good | No good | Suitable |
| Comparative Example 2 | Sn—Pb alloy plating film | Good | Good | Good | Not suitable |

As shown in Table 1, the FFC's of Examples 1, 2 generate no whisker at the surface of the solder plating film of the flat cable conductor in all of the tests. Further, the FFC's of Examples 1, 2 have no problem on the environmental suitability since they are free from Pb.

In contrast, although the FFC of Comparative Example 1 has no problem on the environmental suitability, it generates a whisker at the surface of the solder plating film of the flat cable conductor (pure Sn plating rectangular conductor) in all of the tests. Thus, it is no good at the anti-whisker property.

The FFC of Comparative Example 2 generates no whisker at the surface of the solder plating film of the flat cable conductor (Sn—Pb alloy plating rectangular conductor) in all of the tests. However, it has a problem on the environmental suitability since it contains Pb.

As described above, it is confirmed that, though the flat cable conductors to compose the FFC's of Examples 1, 2 are free from Pb, they have the anti-whisker property equal to that of the flat cable conductor, which is conventionally known as a material with a good anti-whisker property, to compose the FFC of Comparative Example 2.

<Ag Concentration Measurement>

With respect to the FPC of Example 1, the Ag concentration at the surface of the solder plating film in the flat cable conductor is measured.

Figure 4:
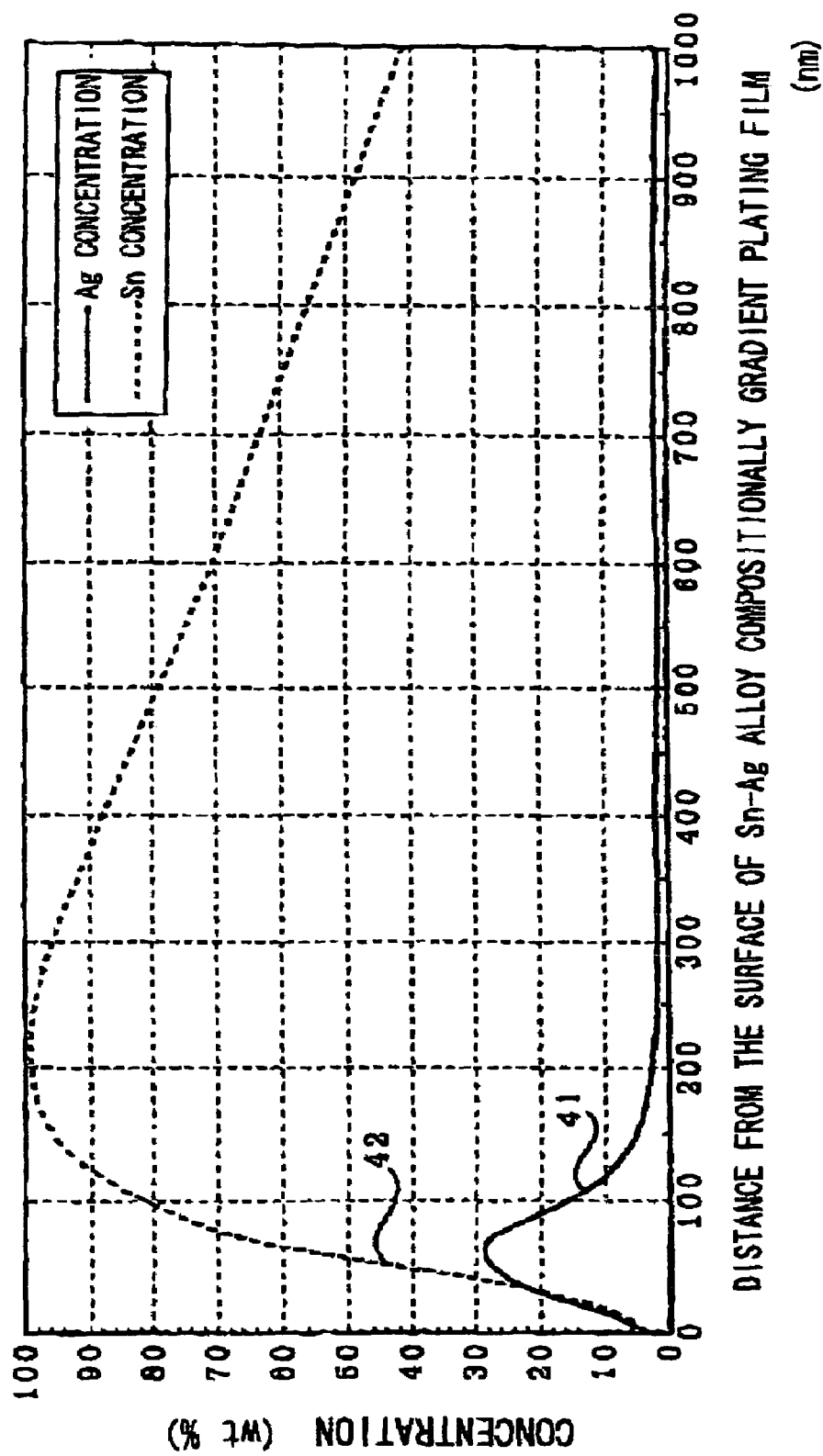
FIG. 4 shows the results of quantitative analysis of Ag and Sn in a Sn—Ag alloy gradient plating film of a flat cable conductor to compose a FFC of Example 1.

FIG. 4 shows the result of quantitative analysis of Ag and Sn in the Sn—Ag alloy gradient plating film of the flat cable conductor to compose the FFC of Example 1. In FIG. 4, a solid curve 41 indicates the Ag concentration (wt %) and a dotted curve 42 indicates the Sn concentration (wt %).

As shown by the solid curve 41 in FIG. 4, the Ag concentration at the outer surface of the Sn—Ag alloy gradient plating film is about 3 wt %. In the range of 0– about 50 nm in distance from the surface of the plating film, as the distance increases, the Ag concentration gradually increases and has a peak (about 28 wt %) at a distance of about 50 nm. In the distance range of about 50 to about 250 nm, as the distance increases, the Ag concentration gradually decreases and becomes nearly zero at a distance of about 250 nm.

In contrast, as shown by the dotted curve 42 in FIG. 4, the Sn concentration at the outer surface of the Sn—Ag alloy gradient plating film is about 2 wt %. In the range of 0– about 200 nm in distance from the surface of the plating film, as the distance increases, the Sn concentration increases and has a peak (about 98 wt %) at a distance of about 200 nm. This proves that the Sn—Ag alloy gradient plating film is formed in the distance range of 0– about 200 nm of the surface of the solder plating.

The reason why the total is not 100 wt % in the vicinity of the outer surface is that an oxide film is formed therein though not shown. Further, in the distance range of more than about 200 nm, as the distance increases, the Sn concentration decreases. This is because, though not shown, Cu contained in the rectangular conductor diffuses into the solder plating film and the Cu concentration is therefore increased in the distance range of more than about 200 nm. This proves that the Sn—Cu alloy gradient plating film is formed in the distance range of more than about 200 nm.

<Zn Concentration Measurement>

With respect to the FFC of Example 2, the Zn concentration at the surface of the solder plating film in the flat cable conductor is measured.

Figure 5:
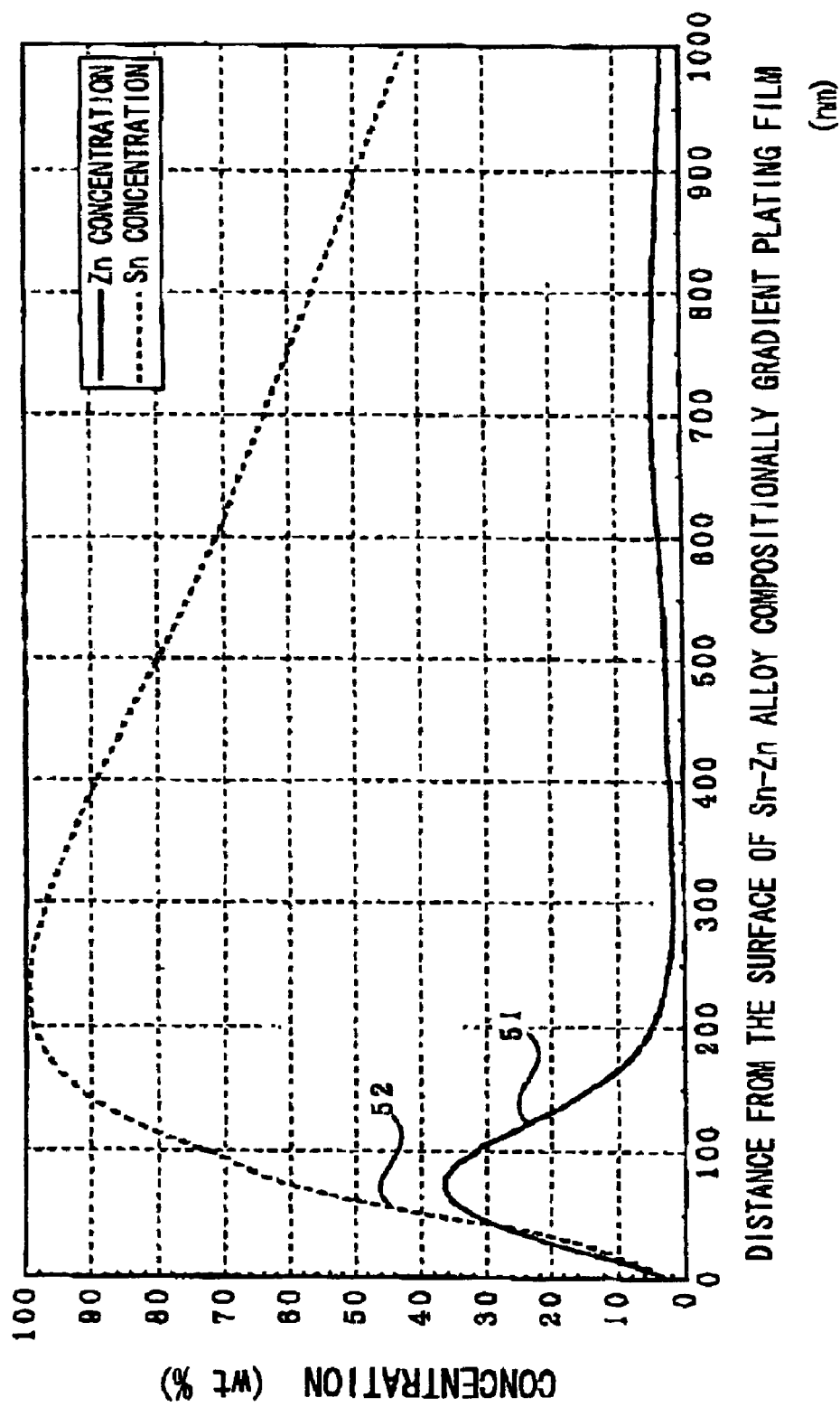
FIG. 5 shows the results of quantitative analysis of Zn and Sn in a Sn—Zn alloy gradient plating film of a flat cable conductor to compose a FFC of Example 2.

FIG. 5 shows the result of quantitative analysis of Zn and Sn in the Sn—Zn alloy gradient plating film of the flat cable conductor to compose the FFC of Example 2. In FIG. 5, a solid curve 51 indicates the Zn concentration (wt %) and a dotted curve 52 indicates the Sn concentration (wt %).

As shown by the solid curve 51 in FIG. 5, the Zn concentration at the outer surface of the Sn—Zn alloy gradient plating film is about 3 wt %. In the range of 0– about 70 nm in distance from the surface of the plating film, as the distance increases, the Zn concentration gradually increases and has a peak (about 36 wt %) at a distance of about 70 nm. In the distance range of about 70 to about 300 nm, as the distance increases, the Zn concentration gradually decreases and becomes nearly zero at a distance of about 300 nm.

In contrast, as shown by the dotted curve 52 in FIG. 5, the Sn concentration at the outer surface of the Sn—Zn alloy gradient plating film is about 2 wt %. In the range of 0– about 230 nm in distance from the surface of the plating film, as the distance increases, the Sn concentration increases and has a peak (about 98 wt %) at a distance of about 230 nm. This proves that the Sn—Zn alloy gradient plating film is formed in the distance range of 0– about 230 nm of the surface of the solder plating.

The reason why the total is not 100 wt % in the vicinity of the outer surface is that an oxide film is formed therein though not shown. Further, in the distance range of more than about 230 nm, as the distance increases, the Sn concentration decreases. This is because, though not shown, Cu contained in the rectangular conductor diffuses into the solder plating film and the Cu concentration is therefore increased in the distance range of more than about 230 nm. This proves that the Sn—Cu alloy gradient plating film is formed in the distance range of more than about 230 nm.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A flat cable conductor, comprising:
   a conductor that comprises a copper or a copper alloy;
   a first plating film that comprises tin and/or a tin-copper alloy, the first plating film being formed around the conductor; and
   a second plating film that comprises an alloy of tin and a third element comprising at least one of Au, Ag, Ni, Ge, Zn and Bi, the second plating film being formed around the first plating film,
   wherein the third element has a concentration from 0.01 to 80 wt % at an outer surface of the second plating film.

2. The flat cable conductor according to claim 1, wherein the second plating film comprises a gradient plating film in which the concentration of the third element increases from an inner circumference of the second plating film toward an outer circumference of the second plating film.

3. The flat cable conductor according to claim 1, wherein the second plating film has a thickness of 1/100 to 1/2 of the thickness of the first plating film.

4. The flat cable conductor according to claim 1, wherein the conductor comprises a rectangular conductor.

5. The conductor of claim 1, wherein the tin concentration in said first plating film increases continuously as the distance from said conductor increases.

6. The conductor of claim 1, wherein said thickness of said second plating film is between 1/10 and 1/3 of said first plating film.

7. The conductor of claim 1, wherein the conductor has a thickness of about 0.05 mm, the second plating film has a thickness of about 0.1 and 0.5 µm, and the first plating film has a thickness of about 0.5 to 5.0 µm.

8. A method of making a flat cable conductor, comprising:
   forming a tin plating film around a conductor that comprises copper or a copper alloy;
   forming a third element plating filmy that comprises a third element that comprises at least one of Au, Ag, Ni, Ge, Zn and Bi, around the tin plating film; and
   applying a diffusion process to the conductor such that an element is mutually diffused between the conductor and the tin plating film and between the tin plating film and the third element plating film,
   wherein, in the diffusion process, a first plating film is formed around the conductor, the first plating film comprising tin and/or a tin-copper alloy, and a second plating film is formed around the first plating film, the second plating film comprising an alloy of tin and a third element that comprises at least one of Au, Ag, Ni, Ge, Zn and Bi.

9. The method of making the flat cable conductor according to claim 8, wherein the diffusion process is conducted such that the third element has a concentration of from 0.01 and 80 wt % at an outer surface of the second plating film.

10. The method of claim 8, wherein the third element in said third element plating film comprises a percentage weight of from 0.01 to 80.

11. The method of claim 8, wherein the concentration of said third element in said third plating film gradually increases as said distance from said tin plating film increases.

12. The method of claim 8, wherein said conductor is rectangular.

13. The method of claim 8, wherein said thickness of said third element plating film is between 1/10 and 1/3 of said tin plating film.

14. The method of claim 8, wherein the conductor has a thickness of about 0.05 mm, the third element plating film has a thickness of about 0.1 and 0.5 µm, and the tin plating film has a thickness of about 0.5 to 5.0 µm.

15. A flat cable comprising:
    a plurality of flat cable conductors that are arranged in parallel into a conductor array; and
    an insulation layer that is formed on both surfaces of the conductor array,
    wherein each of the plurality of flat cable conductors comprises:
    a conductor that comprises a copper or a copper alloy;
    a first plating film that comprises a tin and/or a tin-copper alloy, the first plating film being formed around the conductor; and
    a second plating film that comprises an alloy of tin and a third element that comprises at least one of Au, Ag, Ni, Ge, Zn and Bi, the second plating film being formed around the first plating film,
    wherein the third element has a concentration of from 0.01 and 80 wt % at an outer surface of the second plating film.

16. The flat cable according to claim 15, wherein the insulation layer comprises a plastic film with an adhesive layer formed on one surface thereof.

17. A flat cable conductor, comprising:
    a conductor that comprises copper or a copper alloy; and
    a plating film that comprises tin and an element that comprises at least one of Au, Ag, Ni, Ge, Zn and Bi, the plating film being formed around the conductor,
    wherein the plating film comprises a gradient plating film in which the element has a peak concentration in the vicinity of an outer surface of the plating film.

18. The conductor of claim 17, wherein the peak concentration comprises a percentage weight of from 0.01 to 80.

19. The conductor of claim 17, wherein said concentration of said third element gradually increases as the distance from said conductor increases.

20. The conductor of claim 17, wherein said conductor is rectangular.

* * * * *